(12) United States Patent
Li

(10) Patent No.: US 6,263,198 B1
(45) Date of Patent: *Jul. 17, 2001

(54) MULTI-LAYER PRINTED WIRING BOARD HAVING INTEGRATED BROADSIDE MICROWAVE COUPLED BALUNS

(75) Inventor: Frank Xiaohui Li, San Jose, CA (US)

(73) Assignee: WJ Communications, Inc., Milpitas, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/661,334

(22) Filed: Jun. 14, 1996

(51) Int. Cl.[7] .................................................. H04B 1/26
(52) U.S. Cl. .......................... 455/327; 455/330; 333/246
(58) Field of Search ..................... 174/251, 253, 174/262, 265; 455/330, 326, 325, 327; 333/4, 24 R, 26, 204, 239, 246

(56) References Cited

U.S. PATENT DOCUMENTS

| | | | |
|---|---|---|---|
| 3,541,223 | * 11/1970 | Helms | 174/262 |
| 3,649,475 | 3/1972 | Degnan et al. | 174/256 X |
| 3,991,390 | 11/1976 | Conroy | 333/26 |
| 4,359,781 | * 11/1982 | Hallford | 455/330 X |
| 4,495,479 | * 1/1985 | Hermann | 174/251 X |
| 4,739,519 | * 4/1988 | Findley | 455/330 X |
| 5,125,111 | * 6/1992 | Trinh | 455/327 |
| 5,440,075 | * 8/1995 | Kawakita et al. | 174/265 |
| 5,497,137 | 3/1996 | Fujiki | 336/200 |

OTHER PUBLICATIONS

Muller, "New Developments in Design Contruction of Multilayers", Proceedings of the Printed Circuit World Convention II, vol. 1, Jun., 1981 pp. 68–71.

Hutkin, "Foiled by Gallium Arsenide", Circuits Manufacturing, vol. 26, No. 6, Jun., 1986 pp. 53, 55, 57–58.

Huang, Jandzinski, Stafford, "Multi–Layer Teflon Circuits for RF Applications", Proceedings of the 1995 International Electronics Packaging Conference, Sep., 1995 pp. 32–44.

RF Prime Corporation, "RF Prime Surface Mount Products", RF Prime Corporation Databook, Sep., 1995 pp. 1–2, 7–8, 15–18, 23–24.

* cited by examiner

Primary Examiner—Edward F. Urban
(74) Attorney, Agent, or Firm—Flehr Hohbach Test Albritton & Herbert, LLP (57) ABSTRACT

A microwave broadside coupled balun integral in a multi-layer printed wiring board formed by broadside coupled conductors embedded in the multi-layer printed wiring board. The balun may be used to form components which are integrated into the multi-layer printed wiring board, such as a microwave mixer formed by two of said broadside coupled baluns embedded in a multi-layer printed wiring board and connected to a diode ring quad.

10 Claims, 7 Drawing Sheets

Note: ⊕ Conductive Via (optional)

MULTI-LAYER PRINTED WIRING BOARD HAVING INTEGRATED BROADSIDE MICROWAVE COUPLED BALUNS

FIELD OF THE INVENTION

This invention relates generally to broadside coupled microwave baluns, and more particularly to a printed wiring board having baluns which are embedded in a conventional multi-layer printed wiring board.

BACKGROUND OF THE INVENTION

Broadside coupled baluns are desirable building blocks for the design of broadband microwave and RF mixers. The broadside coupling design provide benefits compared to edge coupled structures. Of particular importance the broadside coupled balun exhibits superior performance due to strong odd mode couplings which increase the ratio of even mode to odd mode impedance, and due to a decrease in processing tolerance sensitivity. In the prior art, these baluns are constructed as discrete components on multi-layer thick film ceramic substrates or on a single layer Duroid board. Such prior art baluns are connected with other circuit elements to form microwave mixers, power amplifiers, and the like, and are generally housed in a metal package or plastic dual inline package. The packages are then attached to a printed wiring board (also commonly referred to as a "printed circuit board"). Such packages, however, are not compatible with printed wiring boards and thus require processing, such as soldering, to mount the packaged component to the board. The prior art baluns are relatively expensive because of the extensive and complex manufacturing processes required for their manufacturer and integration into the printed wiring board. Thus, it is desirable to provide a component that is compatible with conventional printed wiring boards and is less costly to manufacture.

OBJECTS AND SUMMARY OF THE INVENTION

It is an object of the present invention to provide a printed wiring board having an embedded microwave balun.

It is another object of the present invention to provide inexpensive microwave couplers which are integrated into a conventional printed circuit wiring board.

It is another object of the present invention to provide a microwave broadside coupled balun which is formed integral with a printed circuit board and connected to other circuit components carried by the printed circuit board to form microwave devices.

A further object of the present invention is to provide a mixer circuit having baluns formed integral with a printed circuit board.

These and other objects of the invention are achieved by a printed wiring board having integrated broadside microwave coupled baluns embedded in a multilayer printed wiring board.

BRIEF DESCRIPTION OF THE DRAWINGS

The foregoing and other objects of the invention will be more clearly understood from the following description when it is read in connection with the accompanying drawings of which:

FIG. 10 is a sectional view of a mixer circuit in accordance with the present invention showing leads for attachment to a printed wiring board or the like.

DESCRIPTION OF PREFERRED EMBODIMENT(S)

Figure 1:
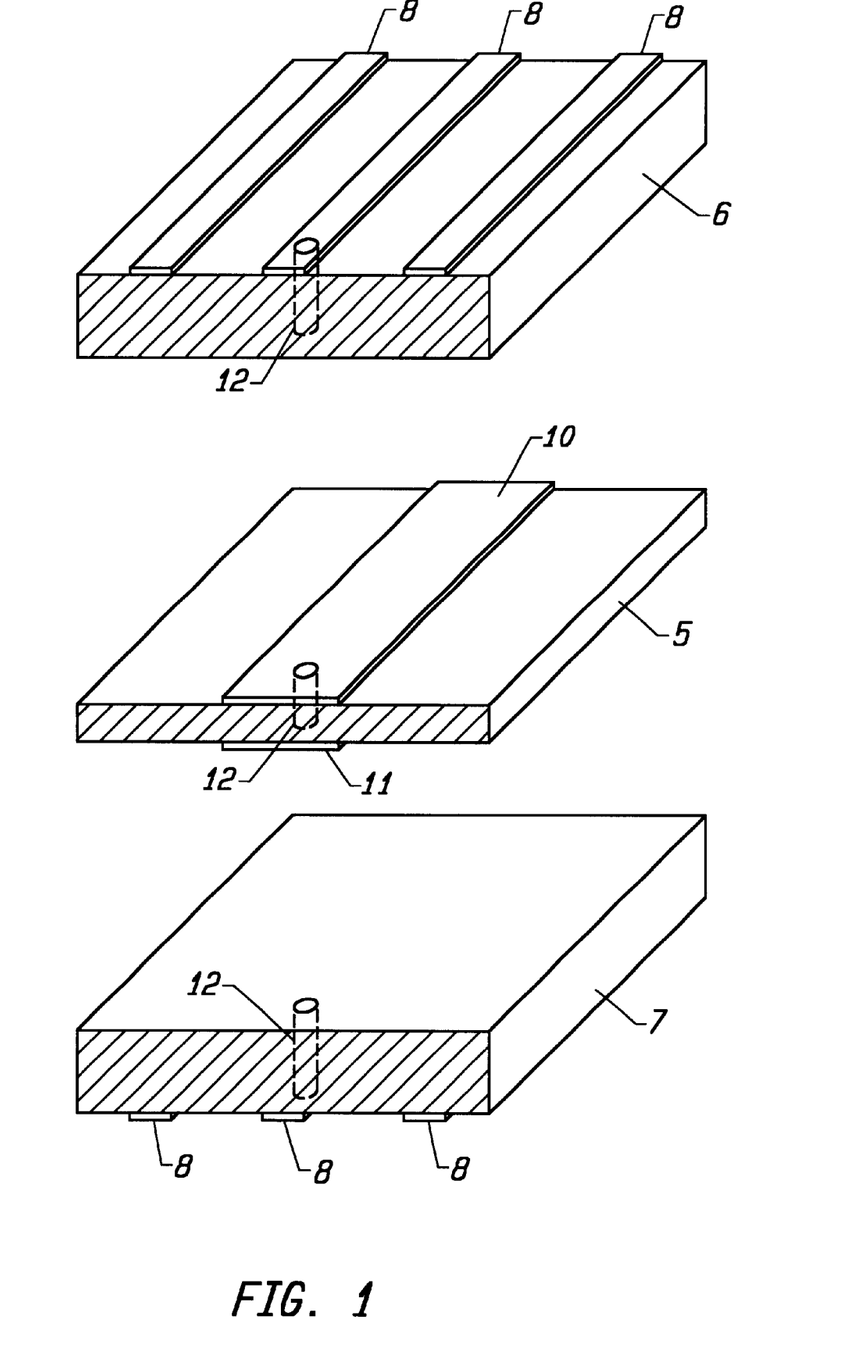
FIG. 1 is an exploded view of a printed wiring board illustrating the multi-layer structure with conductors formed thereon that are used to create baluns according the present invention.

Referring to FIG. 1 there is shown in simplified form to illustrate the building blocks of a further structure, a multi-layer printed wiring board having a dielectric layer 5 sandwiched between first and second outer insulating layers 6 and 7 to form a multi-layer structure. To form an embedded broadside coupled balun (which is described in detail below) the outer surfaces of said first and second outer insulating layers are provided with conductive films 8 which may be selectively etched to form interconnects for connecting circuit components mounted on the surface of the printed board to the structure embedded in the board. In accordance with the present invention, thin elongated conductors 10 and 11 are formed on the opposite surfaces of the center layer of dielectric material 5. The broadsides of the elongated conductors 10 and 11 are directly opposite one another for broadside coupling. These conductors may be formed by the additive process in which the conductors are formed by plating material on both surfaces of the dielectric layer 5 or the conductors can be formed by the subtractive process wherein conductive films on the surfaces of the dielectric layer 5 are photomasked and acid etched to form the conductors 10 and 11. The layers 6 and 7 are laminated and sandwiched to prepreg layer 5 provide a composite printed wiring board with the coupler conductors or traces embedded in the wiring board. Preferably layers 5, 6 and 7 are comprised of the same material for ease of processing. To provide connections to the embedded structure and other circuit components carried on the printed wiring board, a plurality of through connectors or vias 12 (for simplicity only one via is shown in FIG. 1) are formed and extend through the layers 5, 6 and 7 to provide the desired connections.

Figure 2:
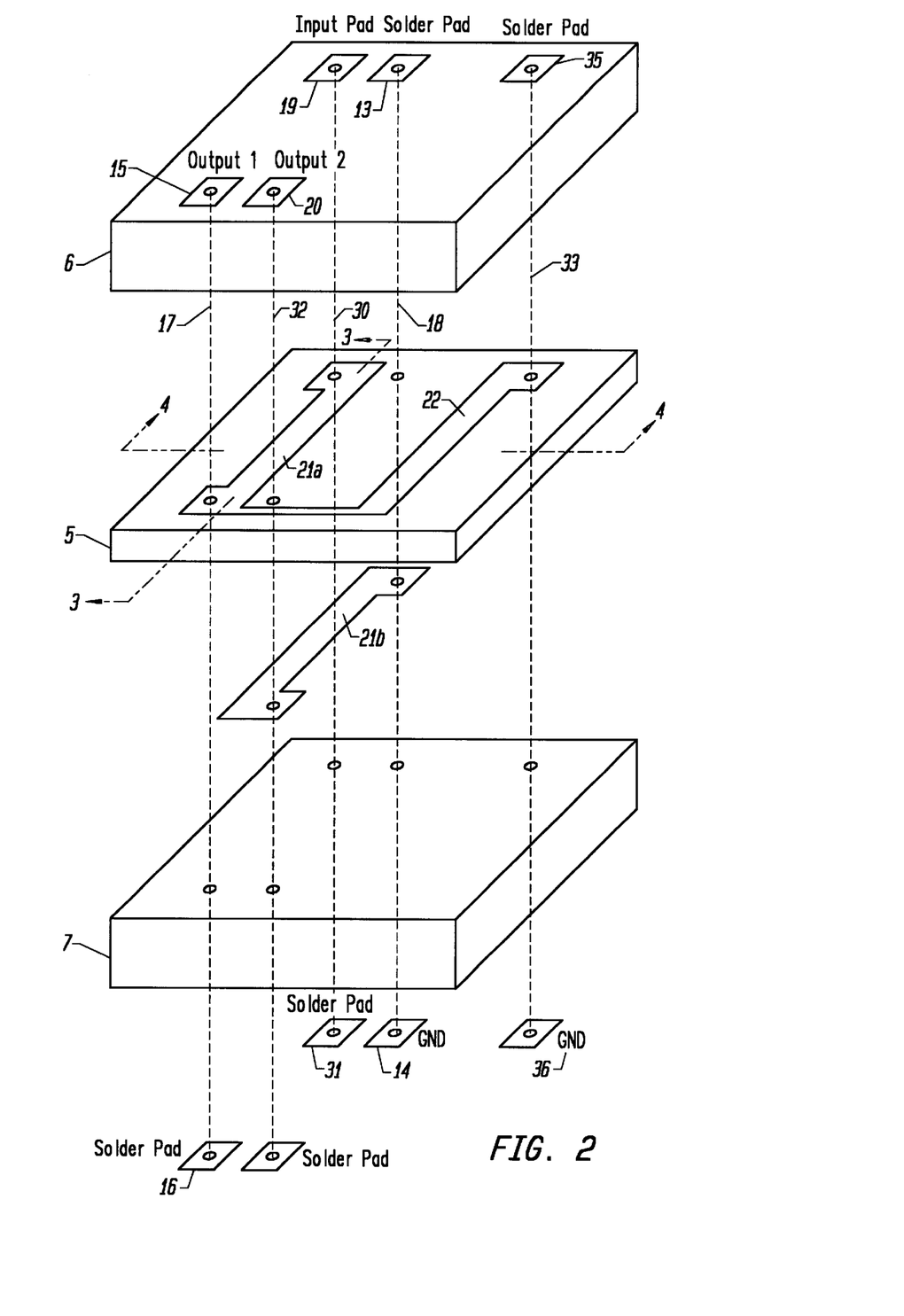
FIG. 2 shows an exploded view of a broadside coupled balun in accordance with the present invention.
Figure 3:
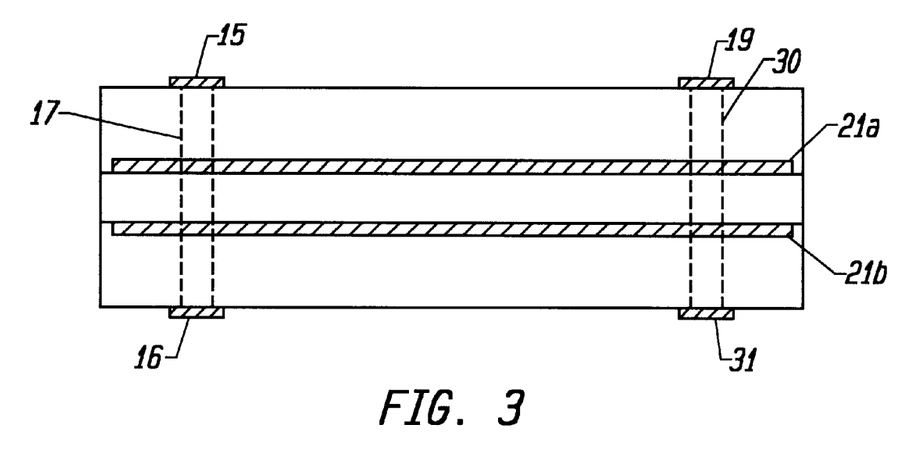
FIG. 3 is a sectional view taken along the line 3–3 of FIG. 2.
Figure 4:
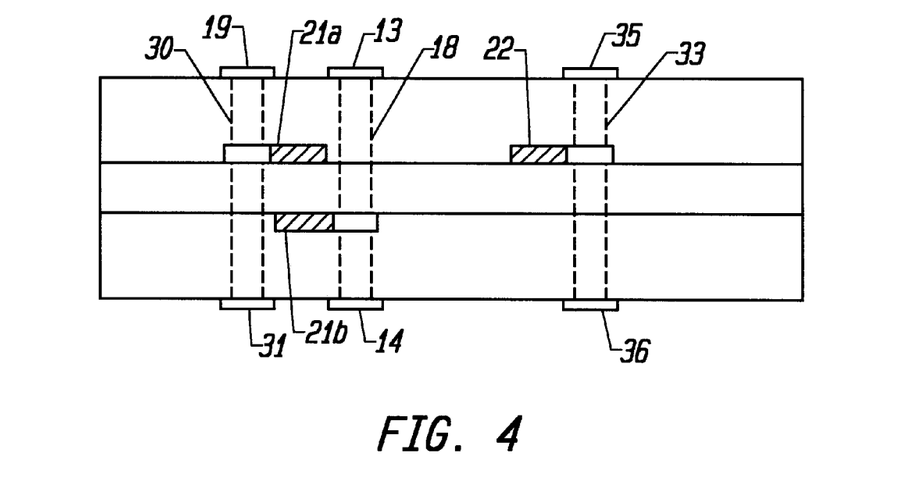
FIG. 4 is a sectional view taken along line 4—4 of FIG. 2.
Figure 5:
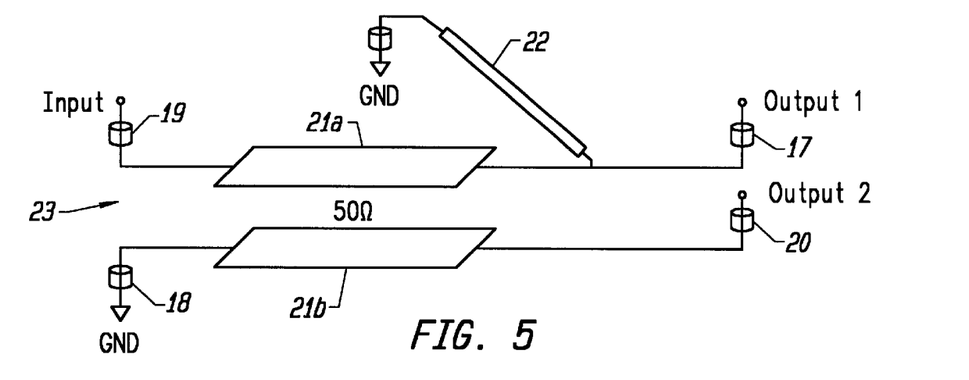
FIG. 5 is a schematic diagram of the broadside coupled balun shown in FIG. 2.

One embodiment of the broadside coupled balun of the present invention is more fully described with reference to FIGS. 2–5. FIG. 2 is an exploded view of a multi-layer printed wiring board having a balun structure formed therein. The printed wiring board includes a center dielectric layer 5 (often referred to as the "prepreg layer") sandwiched between first and second outer insulating layers 6 and 7. The outer surface of first outer layer 6 is provided with a plurality of interconnects. A plurality of through holes, or vias, provide connection through the board to the outer surface of the second layer 7. Thin elongated conductors 21a and 21b are formed on opposite surfaces of the center layer dielectric 5 by either the additive or subtractive process to provide a balun structure 23. The broadsides of the conductors 21a and 21b are placed directly opposite one another to achieve broadside coupling. The first and second outer insulating layers 6, 7 are laminated to the center dielectric layer 5 and elongated conductors 21a, 21b.

The impedance of the coupling balun structure is determined by the width of the conductive traces that form the balun structure 21a and 21b, and the thickness of the center dielectric layer 5 between the two traces. The impedance of the coupled balun structure 21a and 21b is 50 ohms, and an inductive line 22, connected to ground, is formed on one surface of the center dielectric layer 5 to achieve the desired impedance. Alternatively, inductive line 22 may be formed on the surface of either outer insulating layers 6 and 7 with appropriate interconnects to electrically connect line 22 to the balun structure.

Referring again to FIGS. 2–5, plate through holes or vias 17, 18, 30 and 32 are provided to effect electrical connection to the elongated conductors and plate through hole or via 18 may provide connection between the ground layers or interconnect films at the top and bottom of the printed wiring board. In the exemplary embodiment, vias 17 and 30 extend through the printed wiring board and connect to the ends of elongated conductor 21a, and vias 18 and 32 extend through the board to connect to the ends of elongated conductor 21b. Also provided is via 33 extending through the board to connect to the end of impedance line 22. For ease of processing, each via extends through all three layers of the printed wiring board and thus there is provided at each end of the via a interconnect film. For example, via 17 includes interconnect film 15 at the outer surface of layer 6 and interconnect film 16 at the outer surface of layer 7. The interconnect films may provide a connection to other components on the printed wiring board, may connect to ground or may be comprised solely of a solder pad, depending upon the circuit design. In the exemplary embodiment, interconnect films 19 and 15 provide the input and output, respectively, to conductor 21a. The coupled output is shown at interconnect film 20 and the balun is grounded at interconnect film 14.

The remainder of the printed wiring board may be used for other electronic components and circuits. The balun may include more than one coupled circuit and be provided with associated components to form microwave circuits of which is described in connection with FIGS. 6 and 7. It is to be observed, however, that the structure is integrated into the printed wiring board and provides a simple, easy to construct microwave coupling arrangement for use with other components mounted on the printed wiring board.

Figure 6:
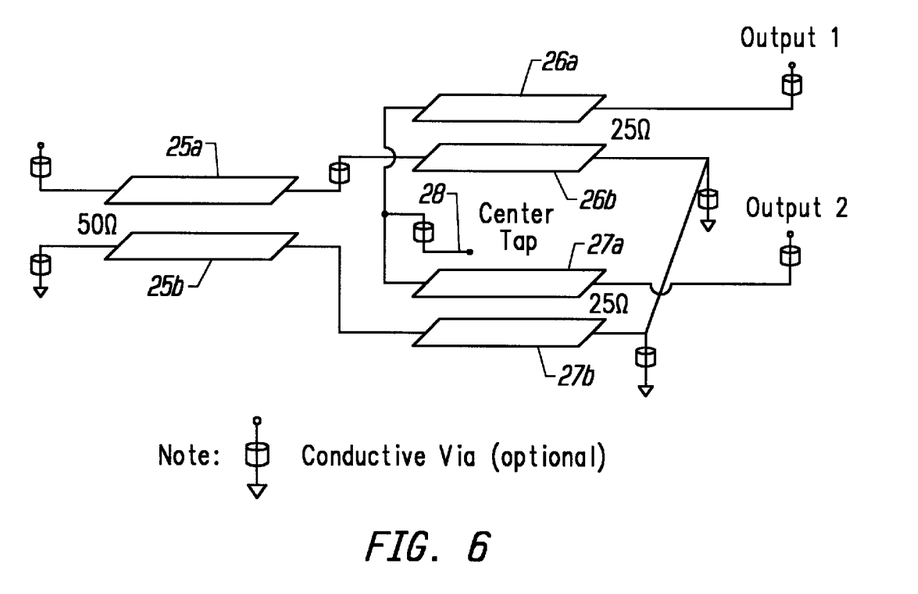
FIG. 6 shows a schematic diagram of an alternative embodiment of the balun in accordance with the present invention.

A schematic diagram of an alternative broadside coupled balun according to the present invention is illustrated in FIG. 6. The balun includes embedded broadside coupled conductor pairs 25a 25b, 26a 26b, and 27a 27b. A microwave input is applied to one end of the elongated conductor 25a and microwave output is received at two outputs at conductors 26a and 27a. The impedance of conductors 25a and 25b is 50 ohms, and the impedance of conductors 26a, 26b and 27a, 27b is 25 ohms, respectively.

As is well known for competent coupling, the conductor should be approximately ¼ wavelength long at the center frequency of the microwave band of frequencies in which the balun is operated.

Figure 7:
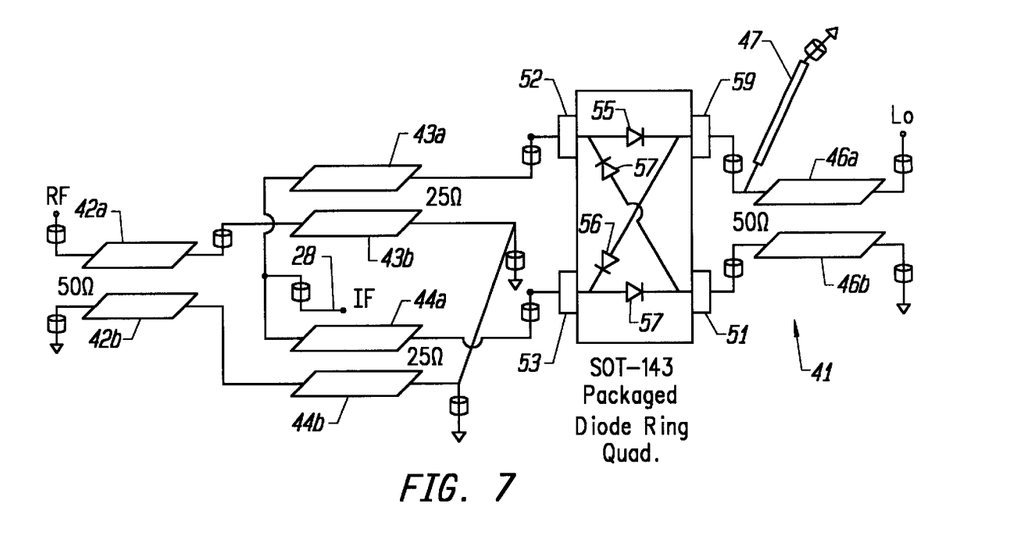
FIG. 7 represents a schematic diagram of a DC coupled microwave mixer formed by integrating the broadside coupled baluns embedded in the multi-layer printed wiring board with a diode ring quad.

FIG. 7 shows a schematic diagram of a microwave mixer incorporating integrated embedded microwave baluns in accordance with the present invention. The mixer includes an RF input balun 40 connected to opposite terminals 52 and 53 of a diode ring quad including diodes 54, 55, 56 and 57 and an LO balun 41 connected to the other diode ring quad terminals 59, 51. A center tap 28 is coupled to one of said baluns to provide an IF output. The RF input balun includes broadside coupled conductor pairs 42a, 42b, 43a, 43b, 44a and 44b. The LO balun includes broadside coupled conductor pairs 46a, 46b and stripline 47. Via connections may be employed if desired to provide the appropriate interconnections.

Figure 11:
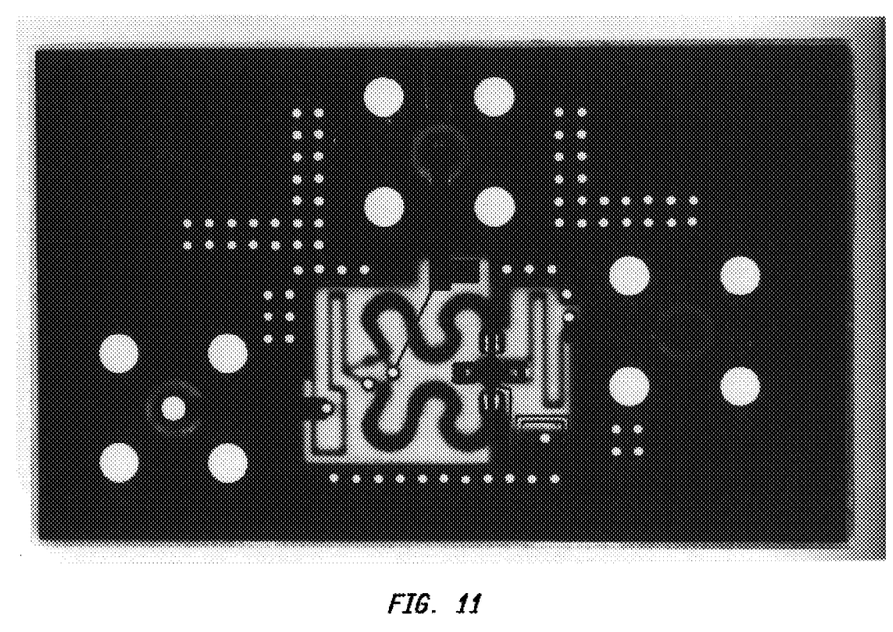
FIG. 11 is a photograph of the mixer of FIG. 7.

FIG. 11 shows a photograph of the mixer circuit, and as clearly seen, the coupled pairs 42 and 46 are zigzag shaped and the coupled pairs 43 and 44 are wave shaped, to reduce the physical dimensions while achieving the desired coupling. Other shapes may be used as well. The structure has symmetrically arranged components to obtain balanced performance.

Figure 8:
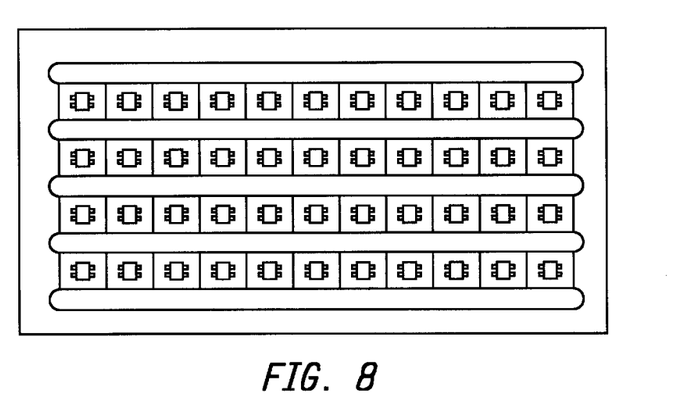
FIGS. 8 and 9 show a plurality of circuits on a production panel to illustrate the steps in manufacturing the mixer of FIG. 7.
Figure 9:
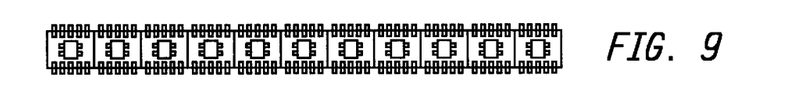
Figure 10:
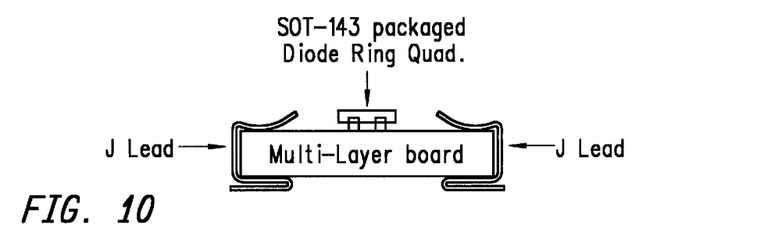
Figure 12:
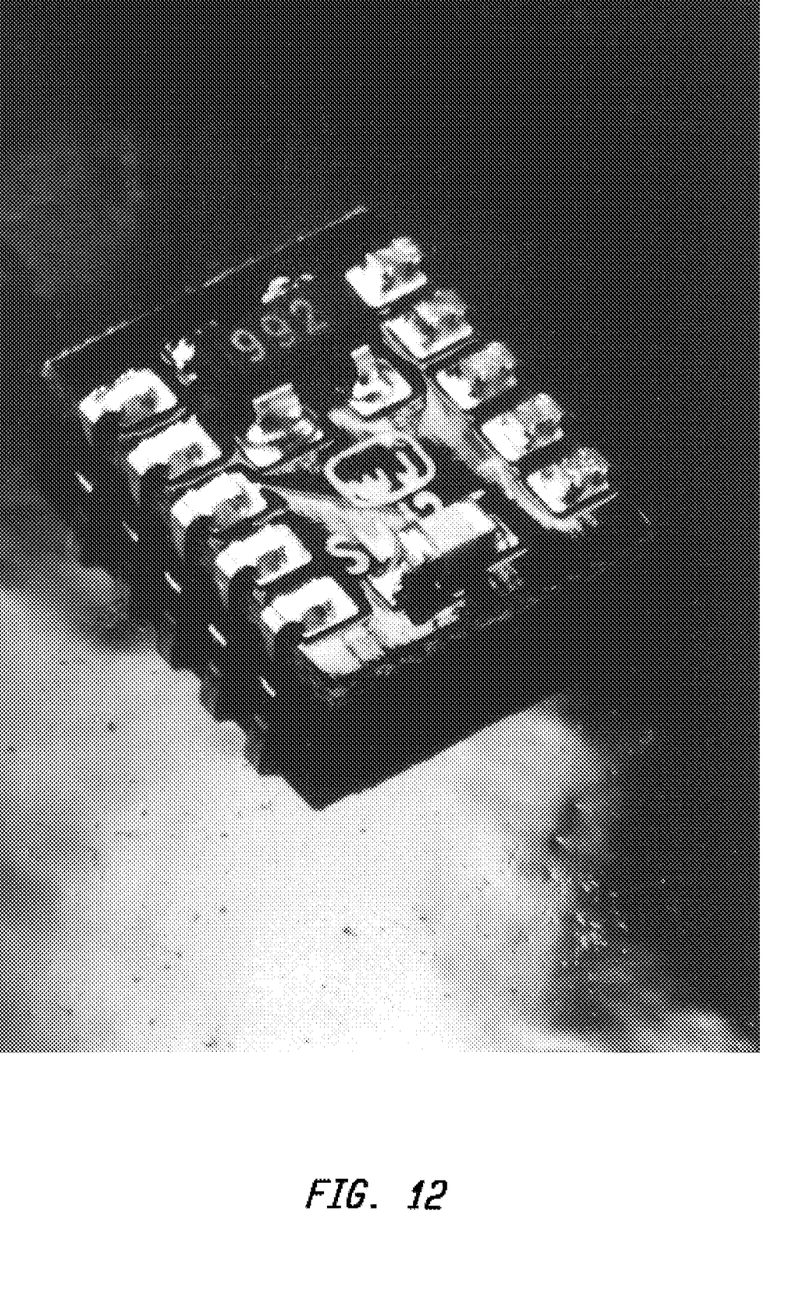
FIG. 12 is another photograph of the mixer of FIG. 7 as a final component showing attached J leads.

The inventive balun structure embedded in a printed wiring board enables the efficient manufacture of components incorporating such baluns. FIG. 8 illustrates a production printed wiring board panel containing a plurality of mixer circuits. To form the mixer circuits, a large panel of the multi-layer printed wiring board is provides which contains the integrated embedded baluns as described above. Diodes, such as a convention SOT-143 packaged diode ring quad are placed on the printed wiring board by a pick-and-place machine followed by conventional reflow processing. The printed wiring board panel is then snapped into long, narrow strips containing a row of mixer circuits as shown in FIG. 9. Conventional J leads frames are easily attached on each side of the strips by reflow processing or manual techniques. The J lead frames are then cut into appropriate lengths. Lastly the strips are snapped to yield individual mixer circuits. FIG. 10 is a sectional view of a final microwave mixer containing two broadside coupled baluns embedded inside the printed wiring board, one diode ring quad placed on the surface of the printed wiring board, and ten J leads attached to each side edge of the printed wiring board. FIG. 12 is a photograph of a mixer component showing the attached J leads.

Thus there has been provided easy to construct microwave baluns which are embedded in a printed multilayer wiring board for connection to associated components to form integrated microwave circuit such as the mixer described above. It will be apparent to those of ordinary skill in the art that the baluns may be used to create many circuits in addition to the mixer described herein, such as IQ modulators or doublers, and balanced amplifiers such as those used in a cellular or PCS base station or handset.

While the invention has been described in connection with specific embodiments, it is evident that many variations, substitutions, alternatives and modifications will be apparent to those skilled in the art in light of the foregoing teaching. Accordingly, this description is intended to encompass all such variations, substitutions, alternatives and modifications as fall within the spirit of the appended claims.

What is claimed is:

1. A broadside microwave coupled balun comprising:
   a printed circuit board having top and bottom surfaces and including a center layer of dielectric material sandwiched between first and second layers of insulating material;

a first embedded thin, elongated conductor of predetermined width formed on one surface of said center layer;

a second embedded thin, elongated conductor of substantially the same predetermined width formed on the other surface of said center layer directly opposite and coincident with said first elongated conductor through substantially all its length, whereby the broad surfaces of the first and second conductors are electrically coupled;

an input feedthrough via extending through said first and second layer of insulating material of said printed wiring board through one end of said first elongated conductor to provide electrical connections from said top and bottom surfaces to the one end of the first conductor;

a ground feedthrough via extending through said first or second layer of insulating materials of said printed circuit board to the end of said second conductor adjacent to the first end of the first conductor to provide a ground connection from said top and bottom surfaces to the said end of the second conductor;

an output feedthrough via extending through said first or second layer of insulating materials of said printed circuit board to the other end of said first elongated conductor to provide electrical connection from said top and bottom surfaces to the other end of said first conductor;

an output feedthrough via extending through said first or second layer of insulating materials of said printed circuit board to the other end of said second elongated conductor to provide electrical connection from said top and bottom surfaces to said other end of said second conductor; and selectively patterned thin conductive traces on each of said top or bottom surfaces for interconnecting said feedthrough vias to form at least one balun.

2. The broadside coupled balun of claim 1 including selectively patterned thin conductive traces on at least one surface of said board for interconnecting said conductors to form input and output baluns and interconnecting the baluns to an outside circuit.

3. The broadside coupled balun of claim 1 wherein said broadside coupled balun is adapted to be connected to circuit components to provide a microwave circuit employing said broadside coupled balun.

4. The broadside coupled balun of claim 1 further comprising a ground plane formed on either of said top or bottom surfaces to form a ground reference and the ground plane is placed remote from the first and second thin elongated conductors to decouple the conductors from ground.

5. A broadside microwave coupled balun as in claim 1 including a conductive trace having one end connected to the output end of said first elongated conductor and its other end adapted to be connected to ground.

6. A printed wiring board microwave mixer comprising:

at least three dielectric layers one being a core layer sandwiched between two outer layers;

a plurality of embedded broadside coupled microwave baluns each having conductor traces and formed on a top and bottom surface of said core layer, said conductor traces being formed of substantially the same predetermined width and directly opposite and coincident with each other through substantially all of their length, whereby the broad surfaces of said conductor traces are electrically coupled;

an input feedthrough via extending from one surface of said one outer layer of said printed wiring board to the opposite surface of said other outer layer of said board and through one end of the conductor trace on one surface of the core layer, a ground feedthrough via extending from one surface of said one outer layer of said printed wiring board to the opposite surface and through the conductor trace on the other surface of the core layer opposite said one end of the conductor trace on the one surface of said core layer, an output feedthrough via extending from the one surface of said one outer layer of said printed wiring board to the opposite surface and through the other end of the conductor trace on the one surface of the core layer, an output feedthrough extending from one surface of said one outer layer of said printed wiring board to the opposite surface and through the other end of the conductor trace on the other surface of the core layer, a diode ring circuit carried on the top surface of one of said outer layers;

connecting traces formed on each of said surfaces of said outer layers for connecting one balun to two baluns and connecting the two baluns to the input of said diode ring circuit, and for connecting another balun to the output of said diode ring circuit.

7. A broadside microwave coupled balun comprising:

a printed circuit board including a core dielectric layer sandwiched between first and second dielectric layers, said core dielectric layer having broadside coupled conductive traces formed by selectively etching a first metallization layer on one surface of the core dielectric layer and a second metallization layer on the other surface of the core dielectric layer opposite said first metallization layer wherein said broadside coupled conductive traces are of substantially the same predetermined width and directly opposite and coincident with each other through substantially all of their length;

interconnect conductors formed by etching third and forth metallization layers, one on the top surface of said first dielectric layer and the other on the bottom surface of said second dielectric layer; and through vias connecting the interconnect conductors to the broadside coupled conductive traces to provide an input connection to one end and an output connection to the other end of the first broadside coupled conductive trace and connection to the end of the second broadside coupled conducting trace opposite the one end of the first broadside conductive trace and an output connection to its other end.

8. The broadside microwave coupled balun of claim 7 wherein said balun is integrated into the printed circuit board having with other circuit components.

9. The broadside coupled balun of claim 7 wherein at least one of said first and second dielectric layers includes metallization forming a ground plane which is placed away from the broadside coupled traces to decouple the traces from ground.

10. A broadside microwave coupled balun as in claim 7 including a conductive trace having one end connected to the output end of said first elongated conductor and its other end adapted to be connected to ground.

* * * * *